United States Patent [19]

Crowe

[11] Patent Number: 4,944,344
[45] Date of Patent: Jul. 31, 1990

[54] HERMETICALLY SEALED MODULAR ELECTRONIC COLD PLATE UTILIZING REFLUX COOLING

[75] Inventor: Lawrence E. Crowe, Lindenwood, Ill.

[73] Assignee: Sundstrand Corporation, Rockford, Ill.

[21] Appl. No.: 264,786

[22] Filed: Oct. 31, 1988

[51] Int. Cl.$^5$ .................... F28D 15/02; H01L 23/42
[52] U.S. Cl. ...................... 165/104.33; 165/104.11; 165/104.21; 361/385
[58] Field of Search ............... 165/104.33, 104.21, 165/104.11, 104.14; 361/385

[56] References Cited

U.S. PATENT DOCUMENTS

| | | |
|---|---|---|
| 2,883,591 | 4/1959 | Camp . |
| 3,100,969 | 8/1963 | Elfving ........................ 165/104.21 |
| 3,324,667 | 6/1967 | Muller ......................... 165/104.33 |
| 4,727,454 | 2/1988 | Neidig et al. . |
| 4,727,455 | 2/1988 | Neidig et al. . |

FOREIGN PATENT DOCUMENTS

217346 12/1984 Japan .

Primary Examiner—Albert W. Davis Jr.
Attorney, Agent, or Firm—Antonelli, Terry, Stout & Kraus

[57] ABSTRACT

A modular reflux cooling plate (10) having a condensing region (11), boiling channels (12) and downcomers (16) which effect reflux cooling of electrical power modules used in aircraft and the like. The condenser (11) and boiling channels (12) can be constituted by longitudinally disposed lanced offset fins (20). Air flow fins (18) are arranged adjacent the condenser (11) to effect cooling of a coolant vapor which has entered the condenser (11) after being boiled from a liquid state in the boiling channels (12) as a result of the heat generated by one or more power modules affixed to an end plate (14) by any suitable means. Temporary thermal storage can be provided in the form of either a thickened end plate (14) or a chamber having lanced offset fins (25) and a normally solid or semi-solid material such as wax or solder.

20 Claims, 6 Drawing Sheets

HERMETICALLY SEALED MODULAR ELECTRONIC COLD PLATE UTILIZING REFLUX COOLING

TECHNICAL FIELD

The present invention relates to a hermetically sealed modular electronic cold plate. More particularly, the present invention relates to a cold plate which utilizes reflux cooling in connection with, for example, electrical power systems used on aircraft in which large, pressure-mounted semiconductors are incorporated for switching purposes.

BACKGROUND ART

In the past, efficient high-flux cooling has been achieved by either wick-type heat pipes or by direct immersion of the device to be cooled in a heat sink liquid. In the latter type of device, circuits are submerged in a fluorocarbon fluid such as freon within a sealed enclosure. As the components dissipate heat, the fluid boils and the vapor bubbles rise to the top of the sealed enclosure to initiate reflux cooling. The vapor is then cooled by extracting heat from the top of the enclosure which causes the vapor to condense and return back to the bottom surrounding the circuits for another heating cycle.

However, each of these types of devices has disadvantages which limits the use thereof in aircraft application in which large switching semiconductors are used, thereby creating a large amount of heat dissipation in a small space.

Wick-type heat pipes are limited by the rate at which cooling fluid can be returned from a condensing zone to a boiling zone adjacent the device being cooled. Conventional wick materials do not achieve sufficiently high heat flux rates to maintain acceptable temperatures in modern electrical power systems with high heat dissipation. Although direct immersion cooling in which the device being cooled causes boiling of a liquid which is later condensed and recycled is very efficient, servicing of the device requires draining the liquid which surrounds it in order to gain access to the device. The device which is cooled by direct immersion must also be packaged in a way which prevents damage from the cooling liquid to the electronic components. This requires extraordinary precautions to make sure that the device is hermetically sealed even after it has been serviced or repaired. Moreover, additional difficulties are encountered in attempting to connect electrical circuits outside the direct immersion sealed enclosure without leakage of the coolant.

Given critical space considerations within aircraft, conventional heat exchangers have also not permitted maximum utilization of space for electrical and electronic packages while, at the same time, permitting adequate cooling. Known heat exchangers are constructed in a way which do not address the problem of configuration. This becomes particularly acute in modern aircraft applications where electronic component power ratings, circuit size and packaging density have increased to address the power requirements for aircraft.

Reflux cooling devices also create internal pressures within the sealed chamber. In the past, this has required greater wall thicknesses and higher overall weight of the reflux enclosure to meet acceptable pressure vessel design criteria. Conventional approaches have not permitted manufacturers to achieve a more compact overall package shape, which is particularly important in aircraft applications. p The use of direct immersion reflux cooling enclosures also has the disadvantage that different circuits immersed in the enclosure will be required to operate at the temperature of the highest heat flux component. This arises from the uniformity of pressure within the vessel which means that all components must operate at the same temperature even if this is not desired for one or more circuits within the enclosure.

Others have attempted to improve upon these two types of cooling arrangements in various ways. In one instance, as shown in Japanese Patent Application 59-217346, a vapor cooling device is provided in which the semiconductor elements to be cooled are disposed externally at the lower part of a liquid reservoir containing a coolant which changes phases between the liquid phase and the vapor phase. As the vaporized coolant rises through a vapor phase pipe 9, it reaches a condensation part where it is condensed between a secondary coolant and then returned to a reservoir through a liquid phase pipe where vapor cooling again begins. However, as a result of this arrangement, it is not possible to stack semiconductor elements in a way which would make the use of the device particularly desirable in the cramped environment of an aircraft. Furthermore, the large internal volume in this arrangement makes it especially undesirable for aircraft use where a small internal volume is necessary because of space considerations in the fuselage, and it does not permit the use of multiple plates to permit different packages from running at different temperatures.

More recently, semiconductor power modules have been proposed in which a heat pipe or capillaries are used to cool the power module. In this connection, U.S. Pat. Nos. 4,727,454 and 4,727,455 are illustrative of these proposals. In one such conventional embodiment, at least one semiconductor power component with a base surface which is soldered to a metallized ceramic substrate. At least one heat conduit or pipe is integrated into the semiconductor power module. The heat conduit includes a condensation area having a larger surface than the base surface over which dissipation heat from the semiconductor power module is distributed. The use of such a module in aircraft applications wherein changes in altitude and "g" forces cause migration of the operating fluid away from the power device to be cooled, thereby decreasing the cooling efficiency, does not provide the overall performance needed in an aircraft electrical power system heat exchanger.

U.S. Pat. No. 4,635,709 attempts to address problems associated with the cooling of electronic devices in aircraft applications. It does so by using air as the primary cooling mode during normal conventional flight. However, a second cooling mode is provided for conditions when air cooling is insufficient or will damage the electronics. This second cooling mode provides a coolant in cold plate grooves. Water or methanol can be used as the coolant which is caused to boil or evaporate as the cold plate heats up. However, this heat exchanger is not intended to work in conjunction with the air flow in order to obtain the cooling benefits of both air cooling and evaporative cooling. Furthermore, it requires that the electronics module be made an integral part of the cooling plate. It also has the disadvantage that the coolant is exhausted overboard and thus is not intended to be recirculated to allow for continuous use, thereby requiring more servicing.

DISCLOSURE OF INVENTION

It is an object of the present invention to overcome the disadvantages encountered with prior art cooling devices and to provide a cooling arrangement which is particularly adapted for use in electric power systems which incorporate large, pressure mounted switching semiconductors of the type typically used on board aircraft where efficient, high-flux cooling is absolutely essential.

It is a further object of the present invention to obtain the advantages of high capacity reflux cooling without the disadvantages of direct immersion of a circuit within a cooling liquid.

It is a further object of the present invention to provide a hermetically sealed modular electronic cold plate utilizing reflux cooling in which the rate at which cooling liquid is returned from a condensing zone to a boiling zone adjacent to the device being cooled is not limited as is the case with wick-type cooling and yet is simple in construction and avoids the previous drawbacks in package configuration, weight and operation.

It is yet a further object of the present invention to provide a hermetically sealed modular electronic cold plate which provides a cooling capacity equivalent to direct immersion cooling but which avoids the need to drain the immersion liquid in order to gain access to the electronic system.

The foregoing objects and advantages of the present invention have been achieved by the provision of a hermetically sealed compact modular electronic cold plate in which a cooling liquid, such as water or a fluorocarbon, is enclosed within a relatively thin sealed enclosure. One or more electrical power devices to be cooled are compression mounted adjacent to the outer surface of the enclosed metal box so as to receive heat from the device without the use of solder which is unacceptable in high power devices. This heat causes the liquid within the enclosure to change to the vapor phase. A condenser located above the boiler elements and devices being cooled to provide a flatter, more compact module receives the boiling vapors through the boiling channels and, as a result of heat exchange with a cooler liquid, lowers the temperature of the vapor and causes condensation on lanced condensing fins which subject the vapor to a tortuous path to maximize condensation. The condensed liquid then flows by gravity through downcomer channels to collect in a pool of liquid at the bottom of the apparatus where it is continuously recycled, reboiled and recondensed.

BRIEF DESCRIPTION OF THE DRAWINGS

These and other objects, advantages and features of the present invention will become more apparent from the following detailed description when taken in conjunction with the accompanying drawings wherein.

BEST MODE FOR CARRYING OUT THE INVENTION

Figure 1:
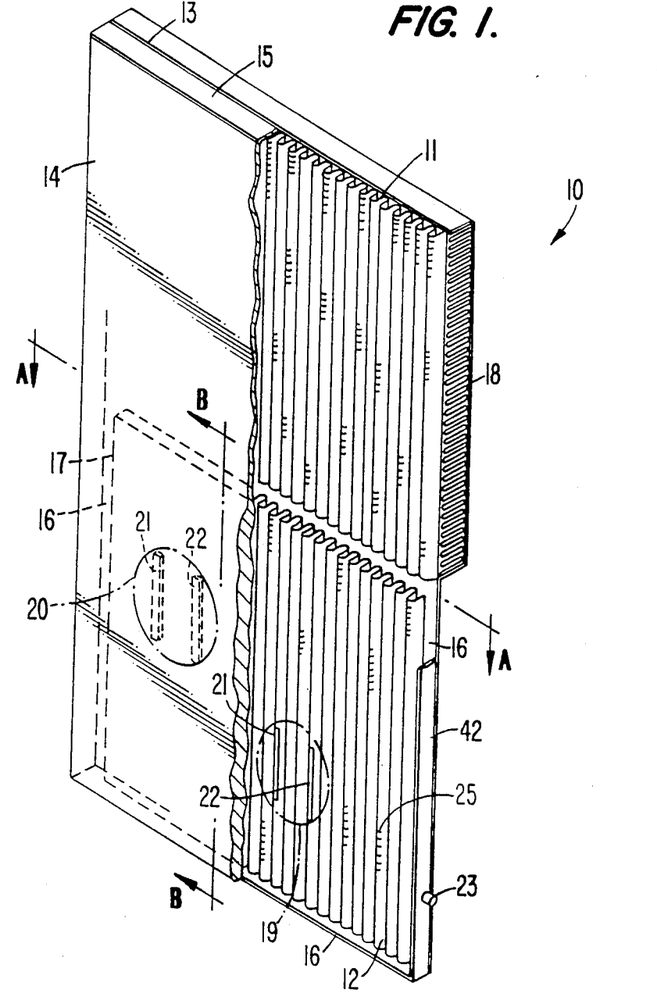
FIG. 1 is a perspective view shown in partial cross-section of the hermetically sealed modular electronic cold plate utilizing the principles of the present invention.
Figure 1A:
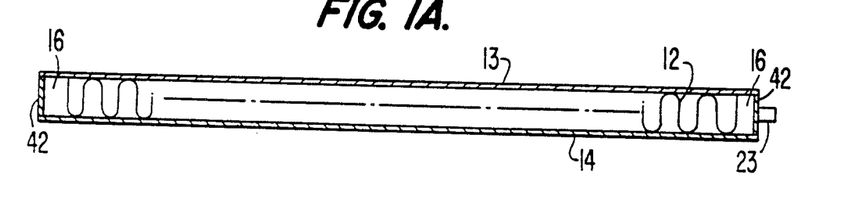
FIG. 1A is a sectional view of the cold plate taken along line A—A in FIG. 1 and showing the reflux section which includes the lanced fins and downcomer channels.

Referring now to the drawings and, in particular, to FIG. 1, there is shown a modular reflux heat sink cold plate which embodies the essential concepts of the present invention. In particular, the relatively thin, flat rectangular plate designated generally by the numeral 10 comprises a condenser region 11 in the form of lanced offset fins and an area below the condenser region 11 where there are provided boiling channels 12 in the form of lanced offset fins and downcomer channels 16 for reasons to be explained herein below.

The reflux plate 10 is fluid-tightly sealed around the condenser region 11 and the channels 12,16 by relatively thin rectangular end sheets 13,14 defining each end face. The end sheets can be made of a clad metal whose properties can be selected for optimal heat exchange characteristics in accordance with known principles. Separating edge closure bars 15 and 42 are brazed to the peripheries of the end sheets 13,14 so as to define a rectangularly shaped space inside the cold plate 10 of sufficient volume to accommodate the condenser fins 11 and the boiling channel fins 12. In terms of assembly, the edge closure bars 15 and 42 can first be arranged completely around the periphery of end sheet 13. Then the condenser region lanced offset fins 11 and the boiling channel lanced offset fins 12 can be arranged within the space defined by the edge closure bars. The boiling channel fins 12 are sized in such a way that they do not extend across the entire width of the space defined by the edge closure bars 42 running along the long sides of the end sheet 13 and at the bottom of the boiling channel fins 12. FIG. 1 illustrates this package size by the phantom lines 17 which show that on each side of the cold plate 10 a downcomer 16 is defined between the edge closure bar 42 and the end of the boiling channels 12 as well as between the bottom of the boiling channels 12 and edge closure bar 15.

As illustrated in FIG. 1, the boiling channels 12 do not abut against the condenser fins 11 but define a space therebetween. It will be appreciated that in some instances, it may not be desirable to have such a space.

Thus, the present invention contemplates the condenser region abutting the boiling channels.

After the condenser fins 11 and boiling channel fins 12 have been appropriately located within the cavity to define the downcomers 16 on each side, the end sheet 14 is clamped in place, and the entire assembly is brazed. During this brazing process, the clad material on the end plates 13,14 is heated to a sufficiently high temperature to cause the portions of the lanced offset fins touching the end plates to be brazed thereto, thereby providing further structural rigidity and strength for the cold plate 10 to withstand internal pressures caused by the reflux cooling described below. An additional plate fin heat exchanger assembly 18 through which air or other suitable heat exchange material can be caused to flow to cool the condenser region 11 and cause the vapor therein to condense can be provided on the other side of end plate 13 coextensive with the condenser region 11 (as shown) or over a lesser portion of that region as may be desired.

After the cold plate 10 has been hermetically sealed by brazing or the like, a liquid such as Freon or water is filled into the area containing the boiling channels 12 and the downcomers 16 through the passage 23. The liquid can be filled to a desired level so that power modules clamped to the end plate 14 will be adjacent the cooling material in its liquid phase and thereby obtain greater cooling efficiency by converting all of the liquid phase to a vapor phase. After the filling operation is complete, the passage 23 is pinched off and hermetically sealed to prevent linkage of the coolant.

Modules such as power thyristors are placed on one or more areas of end plate 14 in the reflux cooling area defined by the boiling channels 12. The "footprint" of these modules is shown in phantom lines 19 and 20 in FIG. 1. Again, it will be appreciated that there need only be one such "footprint" and there can be more than the two shown. To further stiffen the cold plate, particularly in the region where the greatest heat is generated, i.e. under a "footprint", the boiling channel fins 12 can be cut to form spaces to accommodate snugly therein stiffening bars 21,22. In addition to providing reinforcement, the bars 21, 22 can also be configured to incorporate enhanced boiling surface treatment which serve as nucleation points to facilitate boiling of the coolant in the boiling channels.

Figure 1B:
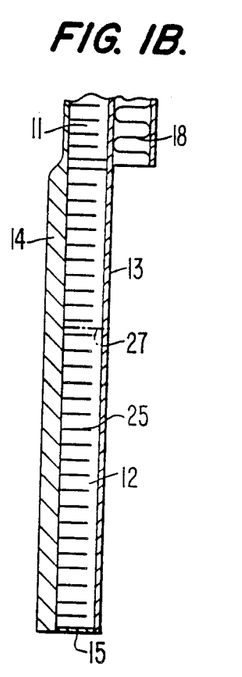
FIG. 1B is a view taken along line B-B in FIG. 1 but showing a thermal storage mechanism in the form of a thickened end plate in the reflux section.
Figure 1C:
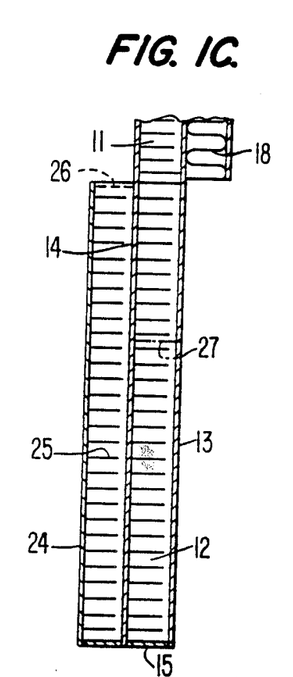
FIG. 1C is a view similar to FIG. 1B showing another embodiment of thermal storage mechanism in the form of lanced offset fins.

As shown in the fragmentary sections in FIGS. 1B and 1C, an optional thermal storage section can be provided at one side of the boiling channels 12 at which the modules are mounted. The thermal storage is provided in the event of cabin depressurization at which time there may be insufficient airflow through the air fins 18 to effect condensation of the coolant (whose liquid level is designated by the numeral 27) after it has undergone boiling and travelled to the condenser 11. Thus the thermal storage means is intended to provide temporary storage of heat generated by the power modules until cabin pressure is normal and a volumetric air supply fan can again supply air in sufficient quantities to the air fins 18 to carry off the heat exchanged from the condenser 11.

FIG. 1B shows one form of thermal storage means in which the end plates 14 is thickened in the boiling channel area. It should be readily apparent that the thickness of the plate will depend upon various design considerations such as the amount of temporary heat storage needed and weight of the cold plate.

Alternatively, as shown in FIG. 1the thermal storage apparatus can take the form of another layer of lanced offset fins 25 disposed between the end plate 14 and another plate 24 upon which the modules will be mounted. Instead of a liquid coolant, the space defined between the plates 14 and 24 can be filled with a thermal wax or eutectic solder of known and commercially available composition whose level is shown by numeral 26. The wax or solder will normally be solid or semi-solid during reflux cooling but will be liquid when reflux cooling is not available.

The temporary thermal storage device in FIGS. 1B and 1C also prevents wide swings in temperature in the event of a rapid change in conditions such as may occur in the condensing region 11 or as a result of a rapid temperature rise in one of the power modules. The thermal storage tends to maintain the desired temperature conditions until stability is restored. It is to be understood, of course, that the principles of the present invention do not require the presence of thermal storage and can be carried out since the cover 14 extends fully across the rear face of the plate 10.

Figure 2:
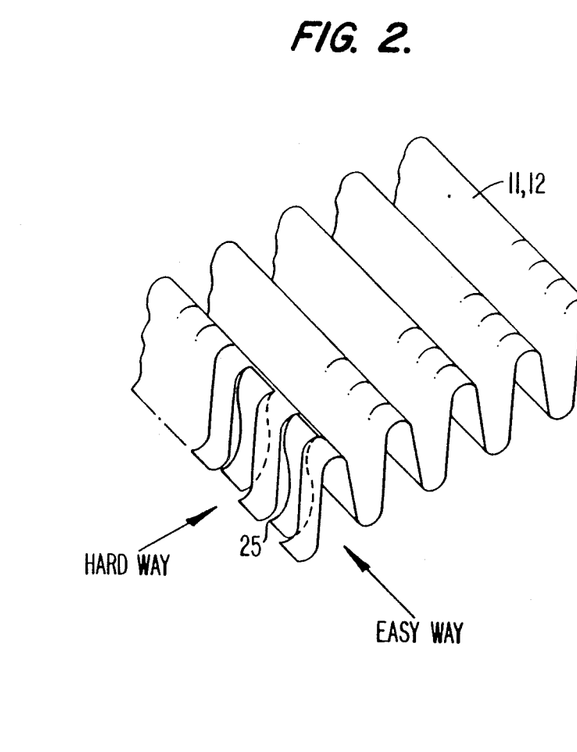
FIG. 2 is a partial perspective view of the lanced offset fins of the type used in the condenser of the modular reflux cooling plate in accordance with the present invention.

FIG. 2 shows in more detail the fin construction of the condenser region 11 and the boiling channels 12. In particular, the structure is known as conventional lanced offset fins 20. It will be appreciated that the lanced offset is provided along the entire length of each fin and the offset permits the vapor cooling material to flow along the length of the fin (the easy way) since this direction presents the fewest obstacles to the passage of the material and transversely of the fin (the hard way). This arrangement assures the maximum degree of heat exchange and condensation of the vapor so that it can be returned to the boiling region to effect heat exchange.

In the illustrated embodiment, the lanced fins are arranged in the condenser 11 and the boiling channels 12 so that the easy way is disposed in the long direction of the rectangular cold plate 10 and the hard way is disposed in the short direction thereof. The pressure of the coolant vapor will cause the vapor to flow both the easy way and the hard way in the condenser region 11 to maximize heat transfer. It will be appreciated that design considerations may dictate that the dimensional characteristics of the lanced offset fins in the boiling channels 12 may be different from the condenser fins 11.

Figure 3:
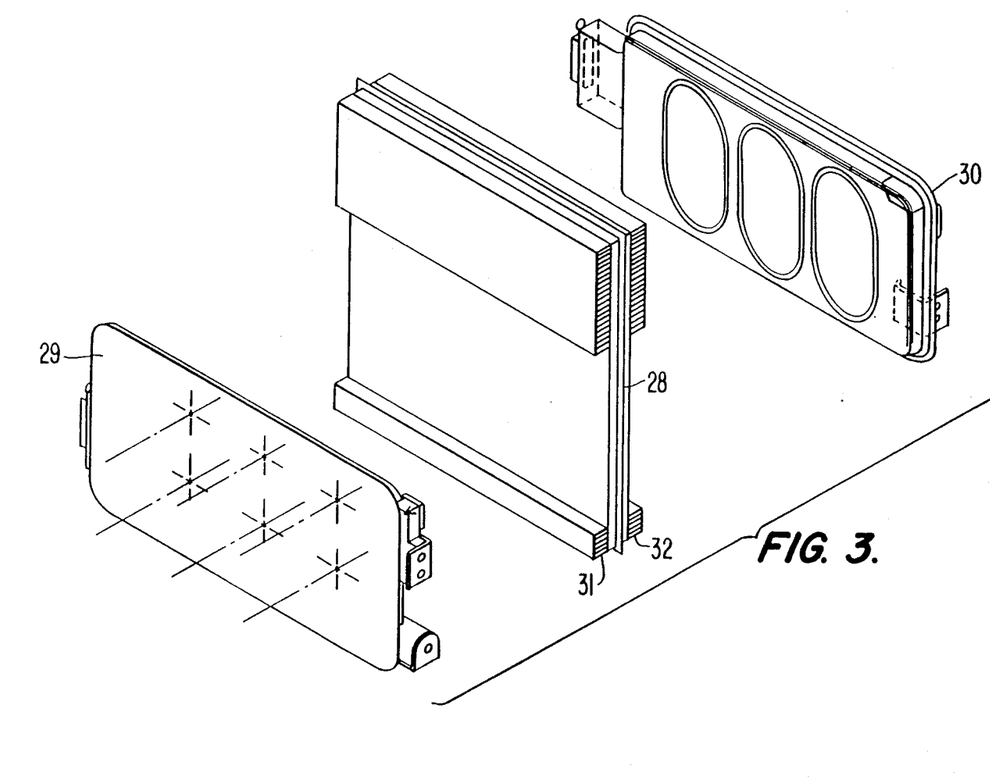
FIG. 3 is a perspective, exploded view of another embodiment of the present invention in which two plates utilizing reflux cooling are mounted back to back so that electronic assemblies can be compression mounted on either side thereof.

FIG. 3 is a perspective view of the type of device shown in FIG. 1 but with two such plates arranged back to back with an insulating parting sheet 28 arranged therebetween. Thus, power modules 29,30 can be compression mounted by clamps of the type shown in FIG. 6 on each side of the dual plate arrangement, while providing a compact stacked arrangement to provide a compact stacked arrangement and avoid the need for soldering of the components to the cooling plate.

Figure 4:
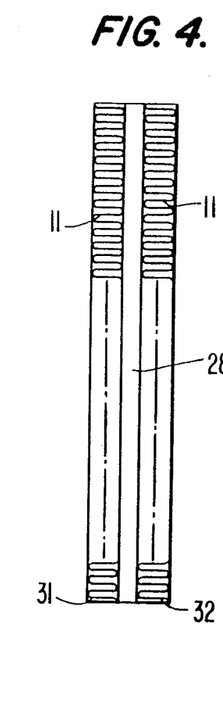
FIG. 4 is a side view of the embodiment of FIG. 3.

Because the modular plate in accordance with the present invention is especially useful for aircraft applications, it may be desirable to provide additional measures for at least partial reflux cooling when the aircraft operates in a temporarily inverted position or where the aircraft undergoes negative "g" forces. To that end, small condenser regions 31,32 can be provided on respective cooling plates as shown in FIGS. 3 and 4 so that with temporary inverted aircraft position or negative "g" forces, liquid boiling and condensation can still take place at least temporarily for cooling the power modules 29,30.

Figure 5:
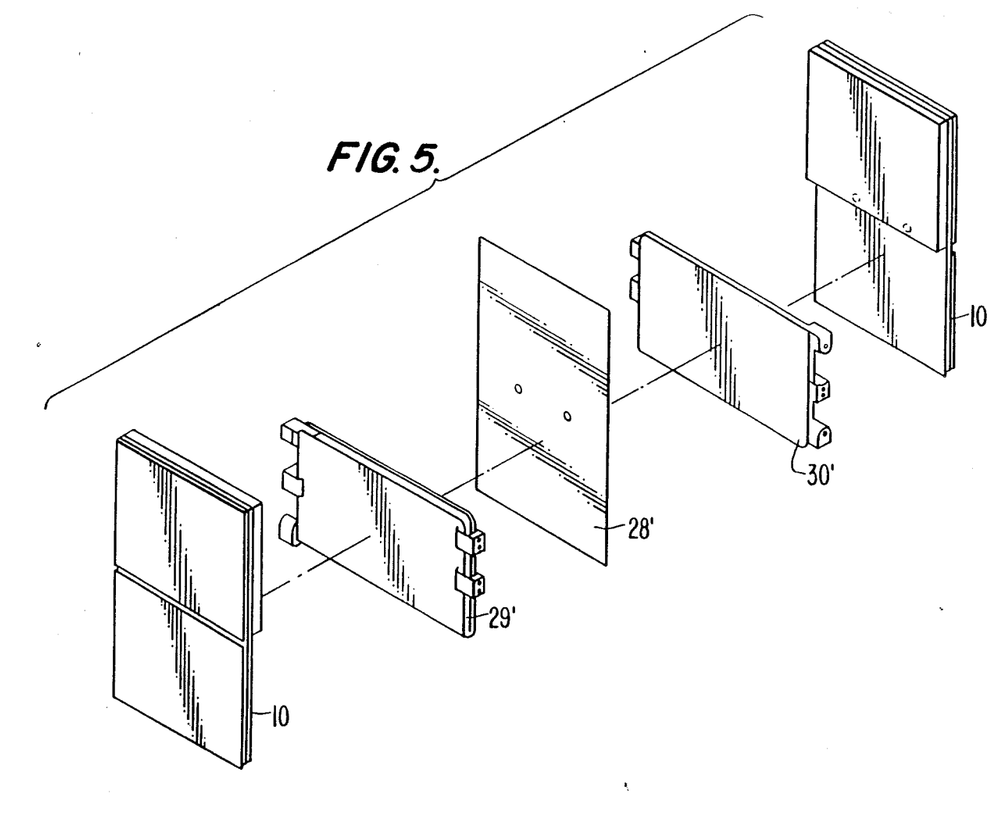
FIG. 5 is an exploded, perspective view of yet another embodiment of the present invention in which the plates are to be compression mounted on the outside of two electric power assemblies and an insulating plate is provided between the assemblies.

FIG. 5 shows yet another embodiment of the present invention wherein the insulating parting sheet 28' is placed between power modules 29',30' to be cooled by the modular plates 10 arranged so as to bound the insulating plate 28' and the modules 29',30' for a compact arrangement which is compression clamped.

Figure 6:
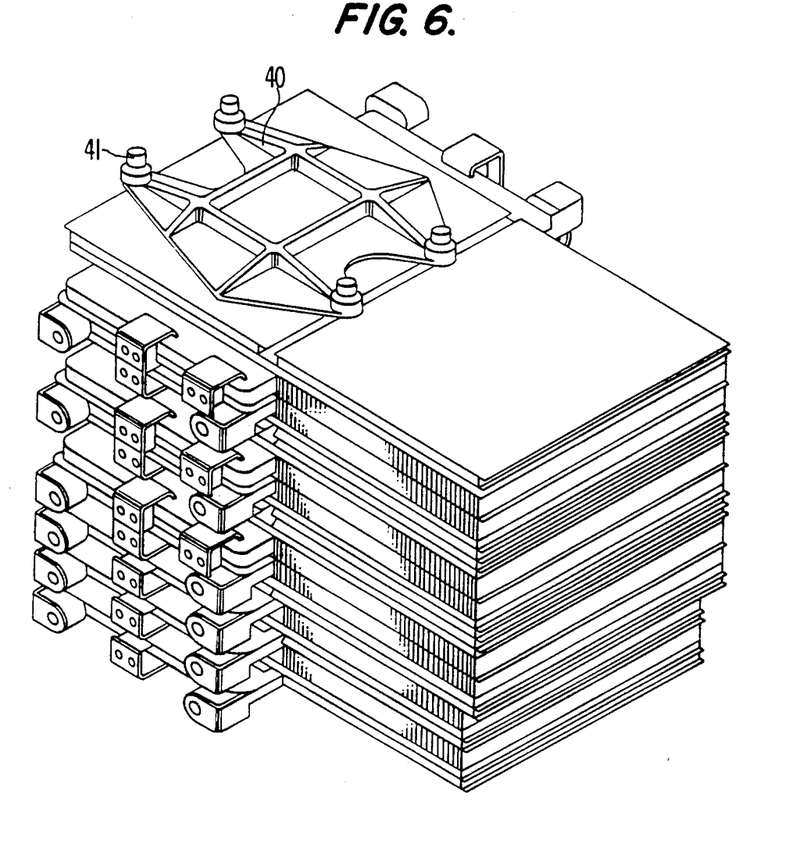
FIG. 6 is a perspective view of an assembly of stacked plates utilizing the present invention and compression clamped together as a unitary package for installation in an aircraft environment.

FIG. 6 shows a stacked arrangement of modules utilizing the two arrangements shown in FIGS. 3 and 5. The entire assembly is clamped by a pair of clamps, one of which is designated by the numeral 40, connected by threaded tie rods 41 which can be tightened to obtain a secure assembly.

While several embodiments in accordance with the present invention have been shown and described, it should be clear that the same is susceptible of numerous changes and modifications without departing from the scope of the present invention. Therefore, this is not intended to be limited to the details disclosed in the specification and drawings but intend to protect all such changes and modifications as are encompassed by the scope of the appended claims.

I claim:

1. A modular reflux cooling plate for one or more heat generating components, comprising:
   a condensing region;
   boiling channels disposed beneath the condensing region;
   at least one downcomer in the vicinity of the boiling channels so as to be operatively communicated between the condensing region and the boiling channels; and
   end plates hermetically sealing the condensing region, the boiling channels and the at least one downcomer therebetween so that a coolant can be provided in the region of the boiling channels, wherein
   the one or more heat generating components are mounted externally on at least one of the end plates adjacent the boiling channels to form an assembly which can be joined with one or more other modular reflux cooling plates with assemblies thereon for providing heat exchange between heat generating components and the condensing region and the condensing region is provided with lanced offset fins.

2. A modular reflux cooling plate according to claim 1, wherein means for supplying cooling air is arranged adjacent the condensing region.

3. A modular reflux cooling plate according to claim 1, wherein downcomers are provided on each side of the boiling channels.

4. A modular reflux cooling plate according to claim 1, wherein means for stiffening the assembly is provided in the boiling channels adjacent at least one of the one or more heat generating components.

5. A modular reflux cooling plate according to claim 1, wherein a means for temporary thermal storage is associated with at least one of the end plates.

6. A modular reflux cooling plate for one or more heat generating components, comprising:
   a condensing region;
   boiling channels disposed beneath the condensing region;
   at least one downcomer in the vicinity of the boiling channels so as to be operatively communicated between the condensing region and the boiling channels; and
   end plates hermetically sealing the condensing region, the boiling channels and the at least one downcomer therebetween so that a coolant can be provided in the region of the boiling channels, wherein
   the one or more heat generating components are mounted externally on at least one of the end plates adjacent the boiling channels to form a assembly which can be joined with one or more other modular reflux cooling plates with assemblies thereon for providing heat exchange between heat generating components and the condensing region; and
   the boiling channels are defined by lanced offset fins.

7. A modular reflux cooling plate for one or more heat generating components, comprising:
   a condensing region;
   boiling channels disposed beneath the condensing region;
   at least one downcomer in the vicinity of the boiling channels so as to be operatively communicated between the condensing region and the boiling channels; and
   end plates hermetically sealing the condensing region, the boiling channels and the at least one downcomer therebetween so that a coolant can be provided in the region of the boiling channels, wherein
   the one or more heat generating components are mounted externally on at least one of the end plates adjacent the boiling channels to form an assembly which can be joined with one or more other modular reflux cooling plates with assemblies thereon for providing heat exchange between heat generating components and the condensing region, and a means for temporary thermal storage is associated with at least one of the end plates, the temporary thermal storage means consisting of the at least one end plate being thicker adjacent the boiling channels than on an area adjacent the condensing region.

8. A modular reflux cooling plate according to claim 7, wherein means for supplying cooling air is arranged adjacent the condensing region.

9. A modular reflux cooling plate according to claim 8, wherein the cooling air supply means comprises air fins for conveying cooling air therealong to remove heat from the condensing region.

10. A modular reflux cooling plate for one or more heat generating components, comprising:
    a condensing region;
    boiling channels disposed beneath the condensing region;
    at least one downcomer in the vicinity of the boiling channels so as to be operatively communicated between the condensing region and the boiling channels; and
    end plates hermetically sealing the condensing region, the boiling channels and the at least one downcomer therebetween so that a coolant can be provided in the region of the boiling channels, wherein
    the one or more heat generating components are mounted externally on at least one of the end plates adjacent the boiling channels to form an assembly which can be joined with one or more other modular reflux cooling plates with assemblies thereon for providing heat exchange between heat generating components and the condensing region, and a means for temporary thermal storage is associated with at least one of the end plates, the temporary thermal storage means comprising hermetically sealed lanced offset fins exteriorly of the at least one end plate adjacent the boiling channels and meltable solid material in spaces defined by the lanced offset fins in the temporary thermal storage means.

11. A modular reflux cooling plate for one or more heat generating components, comprising:

a condensing region;

boiling channels disposed beneath the condensing region;

at least one downcomer in the vicinity of the boiling channels so as to be operatively communicated between the condensing region and the boiling channels; and end plates hermetically sealing the condensing region, the boiling channels and the at least one downcomer therebetween so that a coolant can be provided in the region of the boiling channels, wherein the one or more heat generating components are mounted externally on at least one of the end plates adjacent the boiling channels to form an assembly which can be joined with one or more other modular reflux cooling plates with assemblies thereon for providing heat exchange between heat generating components and the condensing region, and a means for temporary thermal storage is associated with at least one of the end plates, the temporary thermal storage means consisting of the at least one end plate being thicker adjacent the boiling channels than on an area adjacent the condensing region and air fins being arranged adjacent the cooling region for conveying cool air therealong to remove heat from the condensing region.

12. A modular reflux cooling plate according to claim 11, wherein the condensing region is provided with lanced offset fins.

13. A modular reflux cooling plate according to claim 12, wherein the boiling channels are defined by lanced offset fins.

14. A modular reflux cooling plate according to claim 13, wherein downcomers are provided on each side of the boiling channels.

15. A modular reflux cooling plate according to claim 14, wherein means for stiffening the assembly is provided in the boiling channels adjacent at least one of the one or more heat generating components.

16. A modular reflux cooling plate for one or more heat generating components, comprising:

a condensing region;

boiling channels disposed beneath the condensing region;

at least one downcomer in the vicinity of the boiling channels so as to be operatively communicated between the condensing region and the boiling channels; and end plates hermetically sealing the condensing region, the boiling channels and the at least one downcomer therebetween so that a coolant can be provided in the region of the boiling channels, wherein the one or more heat generating components are mounted externally on at least one of the end plates adjacent the boiling channels to form an assembly which can be joined with one or more other modular reflux cooling plates with assemblies thereon for providing heat exchange between heat generating components and the condensing region;

means for temporary thermal storage is associated with at least one of the end plates, means for supplying cooling air is arranged adjacent the condensing region, the cooling air supply means comprising fins for conveying cooling air therealong to remove heat from the condensing region, and the temporary thermal storage means comprises hermetically sealed lanced offset fins exteriorly of the at least one end plate adjacent the boiling channels and meltable solid material in spaces defined by the lanced offset fins in the temporary thermal storage means.

17. A modular reflux cooling plate according to claim 16, wherein the condensing region is provided with lanced offset fins.

18. A modular reflux cooling plate according to claim 17, wherein the boiling channels are defined by lanced offset fins.

19. A modular reflux cooling plate according to claim 18, wherein downcomers are provided on each side of the boiling channels.

20. A modular reflux cooling plate according to claim 19, wherein means for stiffening the assembly is provided in the boiling channels adjacent at least one of the one or more heat generating components.

* * * * *